United States Patent
Lu

(10) Patent No.: US 12,445,770 B2
(45) Date of Patent: Oct. 14, 2025

(54) ELECTROACOUSTIC DEVICE AND ITS CIRCUIT-BOARD END COVER

(71) Applicant: Ariose Electronics Co., Ltd., New Taipei (TW)

(72) Inventor: Yao-Tsun Lu, New Taipei (TW)

(73) Assignee: Ariose Electronics Co., Ltd., New Taipei (TW)

( * ) Notice: Subject to any disclaimer, the term of this patent is extended or adjusted under 35 U.S.C. 154(b) by 189 days.

(21) Appl. No.: 18/235,088

(22) Filed: Aug. 17, 2023

(65) Prior Publication Data

US 2024/0155288 A1  May 9, 2024

(30) Foreign Application Priority Data

Nov. 8, 2022 (TW) ................................. 111142672

(51) Int. Cl.
*H04R 3/00* (2006.01)
*H04R 1/02* (2006.01)
*H05K 1/18* (2006.01)

(52) U.S. Cl.
CPC ............... *H04R 3/00* (2013.01); *H04R 1/02* (2013.01); *H05K 1/18* (2013.01); *H05K 2201/10265* (2013.01)

(58) Field of Classification Search
CPC ... H04R 3/00; H04R 1/02; H05K 1/18; H05K 2201/10265
See application file for complete search history.

(56) References Cited

U.S. PATENT DOCUMENTS

2006/0285707 A1* 12/2006 Izuchi ................. H04R 19/016
381/191

FOREIGN PATENT DOCUMENTS

| CN | 2382100 Y | 6/2000 |
|---|---|---|
| CN | 209880145 U | 12/2019 |
| CN | 210489233 U | 5/2020 |
| CN | 112700759 A | 4/2021 |
| CN | 216119532 U | 3/2022 |
| EP | 1401053 A1 | 3/2004 |
| EP | 3813383 | 4/2021 |
| JP | H11-41683 A | 2/1999 |
| JP | 2003-037884 A | 2/2003 |
| JP | 2003-143679 A | 5/2003 |
| JP | 2003-346959 A | 12/2003 |
| JP | 2005-135744 A | 5/2005 |
| JP | 2007-173017 A | 7/2007 |
| JP | 2007-235740 A | 9/2007 |
| TW | 386627 U | 4/2000 |
| TW | M637254 U | 2/2023 |
| WO | 2010/095596 A1 | 8/2010 |

(Continued)

*Primary Examiner* — Andrew Sniezek
(74) *Attorney, Agent, or Firm* — CKC & Partners Co., LLC

(57) ABSTRACT

An electroacoustic device includes a top cover, an electroacoustic unit and a circuit-board end cover. One end surface of the top cover is formed with a sunken portion and a first coupling portion. The electro-acoustic unit is fixed within the sunken portion. The circuit-board end cover completely covers the sunken portion. The circuit-board end cover includes a wiring board module, an elastic conductive member and a second coupling portion. The elastic conductive member is electrically connected the wiring board module and the electro-acoustic unit. The second coupling portion is located on the wiring board module and connected to the first coupling portion.

19 Claims, 9 Drawing Sheets

(56) References Cited

FOREIGN PATENT DOCUMENTS

| WO | 2010095596 | | 8/2010 |
|----|------------|----|--------|
| WO | 2022009473 | A1 | 1/2022 |

* cited by examiner

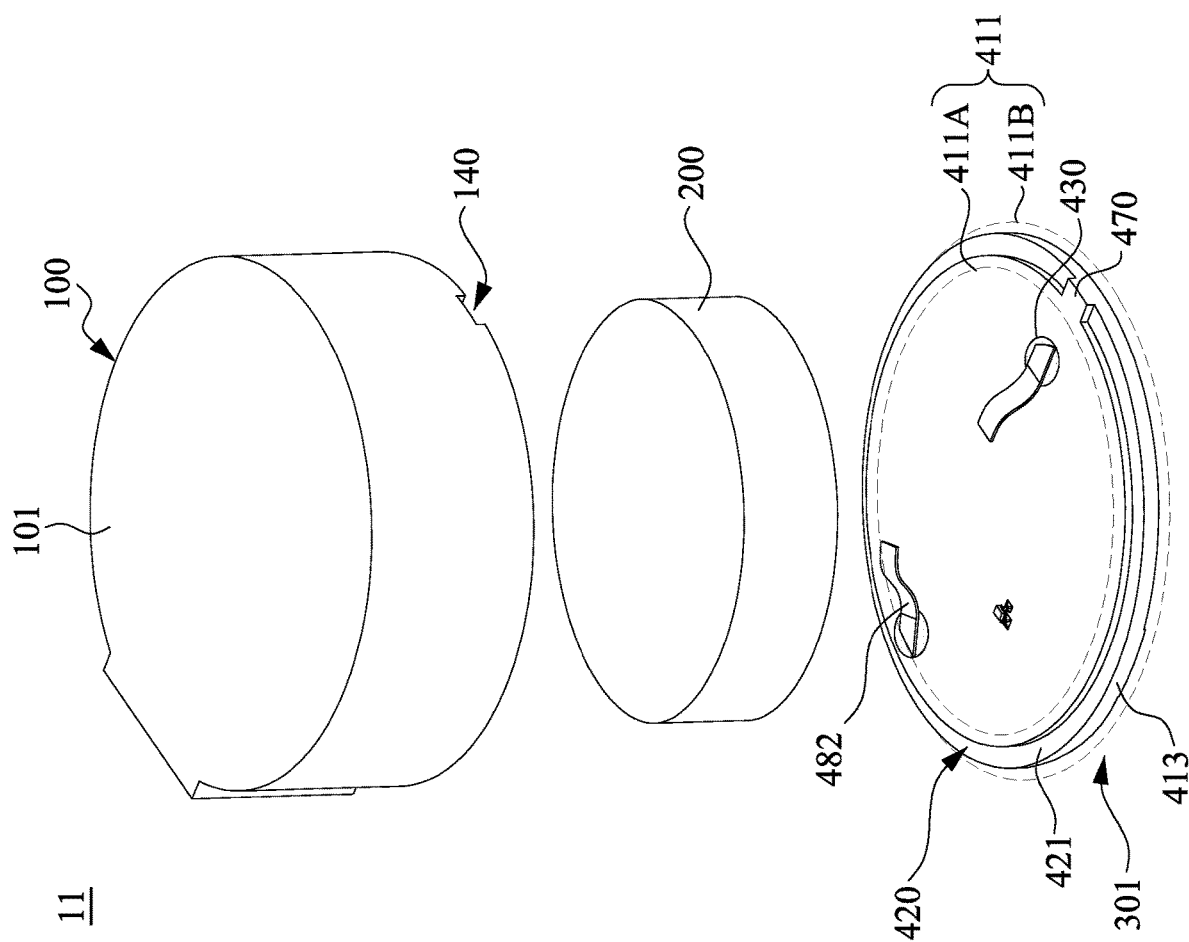

ELECTROACOUSTIC DEVICE AND ITS CIRCUIT-BOARD END COVER

RELATED APPLICATIONS

This application claims priority to Taiwan Application Serial Number 111142672, filed on Nov. 8, 2022, which is herein incorporated by reference in its entirety.

BACKGROUND

Field of Disclosure

The present disclosure relates to an end cap of an electroacoustic device. More particularly, the present disclosure relates to a circuit-board end cover of an electroacoustic device.

Description of Related Art

Generally, an electroacoustic component such as a dynamic speaker is generally welded on a circuit board through a plastic bottom cover via surface mount technology (SMT), so as to be driven to sound through the circuitry of the circuit board.

However, the objective of lightweight and compact designs is pursuit in the current industry, the industry venders all aim to improve the thickness of the aforementioned electroacoustic component to save materials and reduce labor time, thus enhancing the market competitiveness of the products.

Therefore, the above-mentioned technology apparently is still with inconvenience and defects and needed to be further develop. Hence, how to develop a solution to improve the foregoing deficiencies and inconvenience is an important issue that relevant persons engaged in the industry are currently unable to delay.

SUMMARY

One aspect of the present disclosure is to provide an electroacoustic device and its circuit-board end cover for solving the difficulties mentioned above in the prior art.

In one embodiment of the present disclosure, an electroacoustic device includes a top cover, an electro-acoustic unit and a circuit-board end cover. One end surface of the top cover is formed with a sunken portion and a first coupling portion. The electro-acoustic unit is fixed within the sunken portion. The circuit-board end cover completely covers the sunken portion. The circuit-board end cover includes a wiring board module, at least one elastic conductive member and a second coupling portion. The elastic conductive member is fixed on the wiring board module and electrically connected the wiring board module and the electro-acoustic unit. The second coupling portion is located on the wiring board module and connected to the first coupling portion.

In one or more embodiments of the present disclosure, the wiring board module includes a wiring board body, at least one first contact, at least one second contact and a layout circuit. The wiring board body is formed with a first surface and a second surface which are opposite to each other. The first surface is bonded to the end surface of the top cover and completely covering the sunken portion. The first contact is formed on the first surface and connected to the elastic conductive member. The second contact is formed on the second surface. The layout circuit is installed within the wiring board body and connected to the first contact and the second contact, respectively.

In one or more embodiments of the present disclosure, the first surface of the wiring board body is divided into a circuit area and a surrounding groove. The layout circuit is deployed within the circuit area, and the surrounding groove surrounds the circuit area. The top cover is provided with a rim protruding outwardly from a part of the end surface of the top cover. The circuit-board end cover is assembled with the top cover through the rim extending into the surrounding groove.

In one or more embodiments of the present disclosure, the first coupling portion is disposed at the rim of the top cover, the second coupling portion is disposed at a bottom surface of the surrounding groove of the wiring board body. The second coupling portion and the first coupling portion are complementary in shape, and the first coupling portion and the second coupling portion are concave structure and convex structure, respectively.

In one or more embodiments of the present disclosure, the circuit-board end cover further includes a side frame unit fixed between the top cover and the wiring board module. The second coupling portion is formed on the side frame unit.

In one or more embodiments of the present disclosure, the wiring board module includes a wiring board body, at least one first contact, at least one second contact and a layout circuit. The wiring board body is formed with a first surface and a second surface which are opposite to each other, and the first surface integrally engaged with the side frame unit. The first contact is formed on the first surface and connected to the elastic conductive member. The second contact is formed on the second surface. The layout circuit is installed within the wiring board body and connected to the first contact and the second contact, respectively.

In one or more embodiments of the present disclosure, the first surface of the wiring board body is divided into a circuit area and a surrounding groove. The layout circuit is deployed within the circuit area, and the surrounding groove surrounds the circuit area, and the side frame unit is fixed within the surrounding groove to surround the circuit area.

In one or more embodiments of the present disclosure, the top cover is provided with a rim protruding outwardly from a part of the end surface of the top cover. The side frame unit surrounds an inner space capable of accommodating the circuit area. The circuit-board end cover is assembled with the top cover through the rim extending into the inner space.

In one or more embodiments of the present disclosure, the first coupling portion is formed on an inner side of the rim, the second coupling portion is formed on an inner wall of the side frame unit facing towards the inner space, and the second coupling portion and the first coupling portion are complementary in shape, and the first coupling portion and the second coupling portion are concave structure and convex structure, respectively, wherein the circuit-board end cover is fixedly connected to the top cover by inserting the convex structure into the concave structure.

In one or more embodiments of the present disclosure, a maximum width of the wiring board module is equal to a maximum width of the top cover.

In one or more embodiments of the present disclosure, the electro-acoustic unit is one of a speaker, a microphone and a buzzer.

In one or more embodiments of the present disclosure, the elastic conductive member is one of a spring and an elastic piece.

In one embodiment of the present disclosure, a circuit-board end cover is suitable for covering a top cover of an electroacoustic device and electrically conducting to an electro-acoustic unit received within the top cover, and the circuit-board end cover includes a wiring board module, at least one elastic conductive member and a coupling portion. The elastic conductive member is fixed on the wiring board module and electrically connected to the wiring board module. The coupling portion is located on the wiring board module for connecting to the top cover.

In one or more embodiments of the present disclosure, the wiring board module includes a wiring board body, at least one first contact, at least one second contact and a layout circuit. The wiring board body is formed with a first surface and a second surface which are opposite to each other. The first contact is formed on the first surface and connected to the elastic conductive member. The second contact is formed on the second surface. The layout circuit is installed within the wiring board body and connected to the first contact and the second contact, respectively.

In one or more embodiments of the present disclosure, the first surface of the wiring board body is divided into a circuit area and a surrounding groove. The layout circuit is deployed within the circuit area, and the surrounding groove surrounds the circuit area.

In one or more embodiments of the present disclosure, the coupling portion is disposed at a bottom surface of the surrounding groove of the wiring board body.

In one or more embodiments of the present disclosure, the circuit-board end cover further includes a side frame unit. The side frame unit is fixed within the surrounding groove to surround the circuit area and surrounds an inner space capable of accommodating the circuit area. The coupling portion is formed on the side frame unit.

In one or more embodiments of the present disclosure, the coupling portion is formed on an inner wall of the side frame unit facing towards the inner space.

In one or more embodiments of the present disclosure, a maximum width of the wiring board module is equal to a maximum width of the top cover.

In one or more embodiments of the present disclosure, the elastic conductive member is one of a spring and an elastic piece.

Thus, through the construction of the embodiments above, the disclosure is able to simplify the structure of the electroacoustic device, effectively shorten the overall thickness of the electroacoustic device, save materials and shorten labor hours, thereby improving the market competitiveness of products.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

FIG. 4 is a disassembled view of the electroacoustic device according to one embodiment of the present disclosure.

DESCRIPTION OF THE EMBODIMENTS

Figure 1:
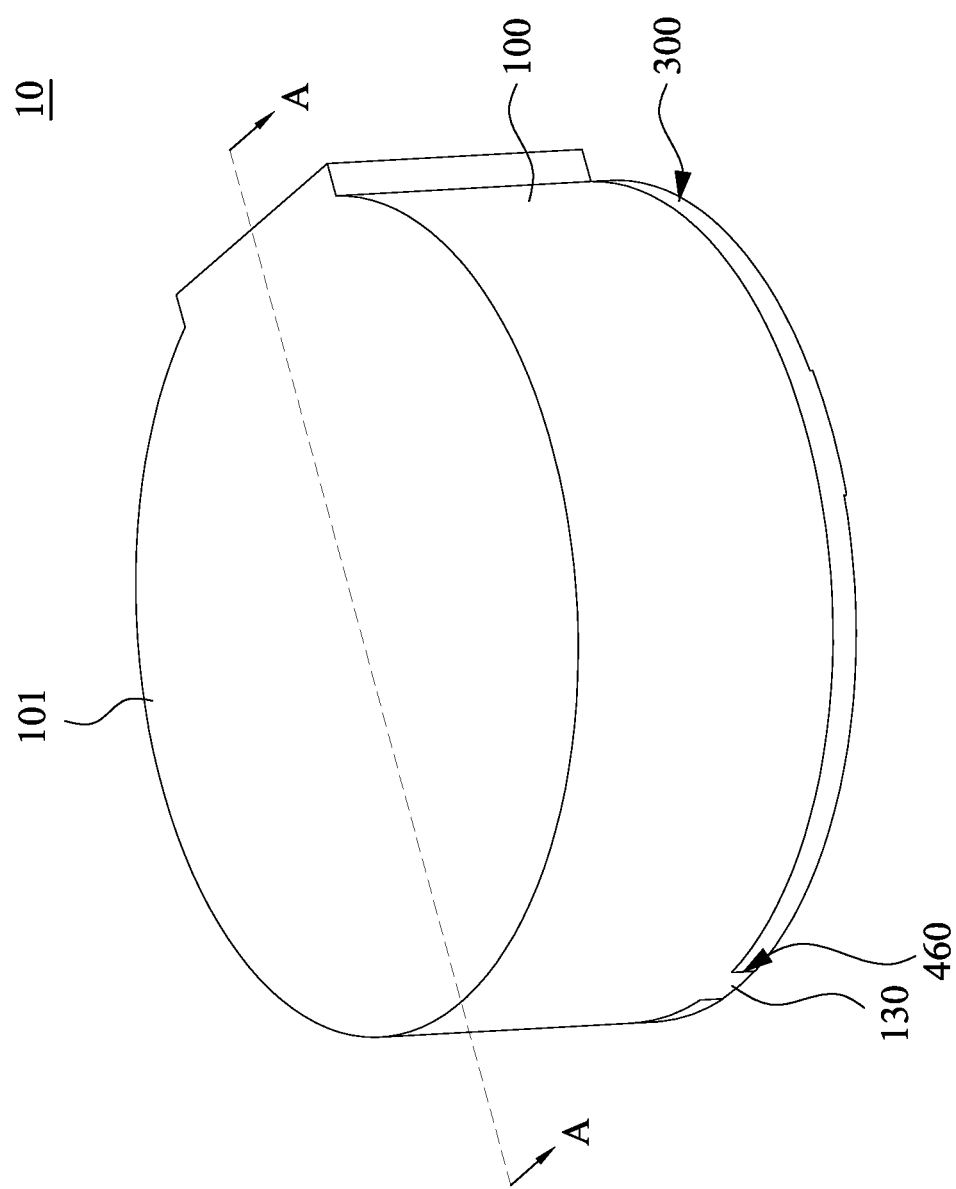
FIG. 1 is a perspective view of an electroacoustic device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
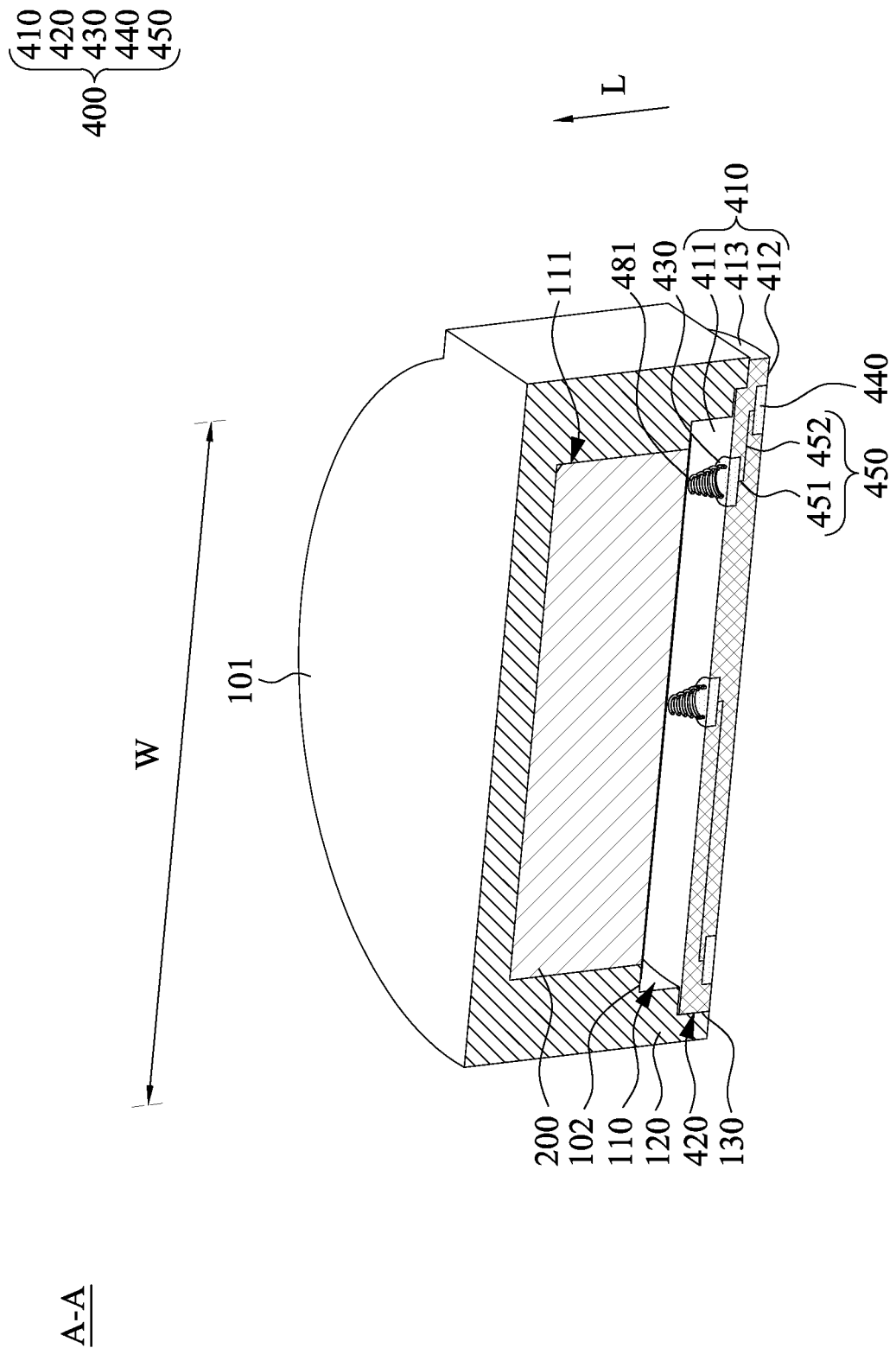
FIG. 2 is a cross-sectional view of the electroacoustic device viewed along a line AA of FIG. 1.
Figure 3B:
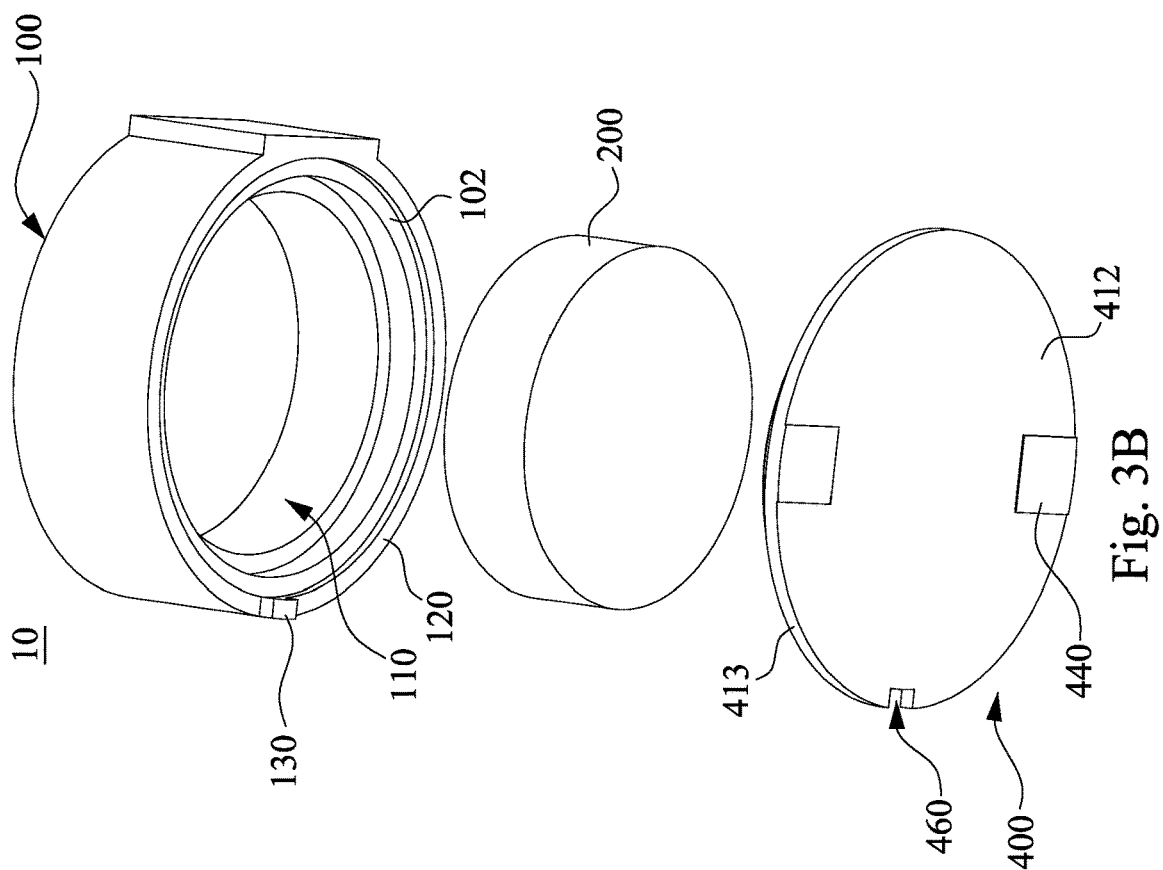
FIG. 3B is a disassembled view of the electroacoustic device of FIG. 1 viewed from another aspect.
Figure 3A:
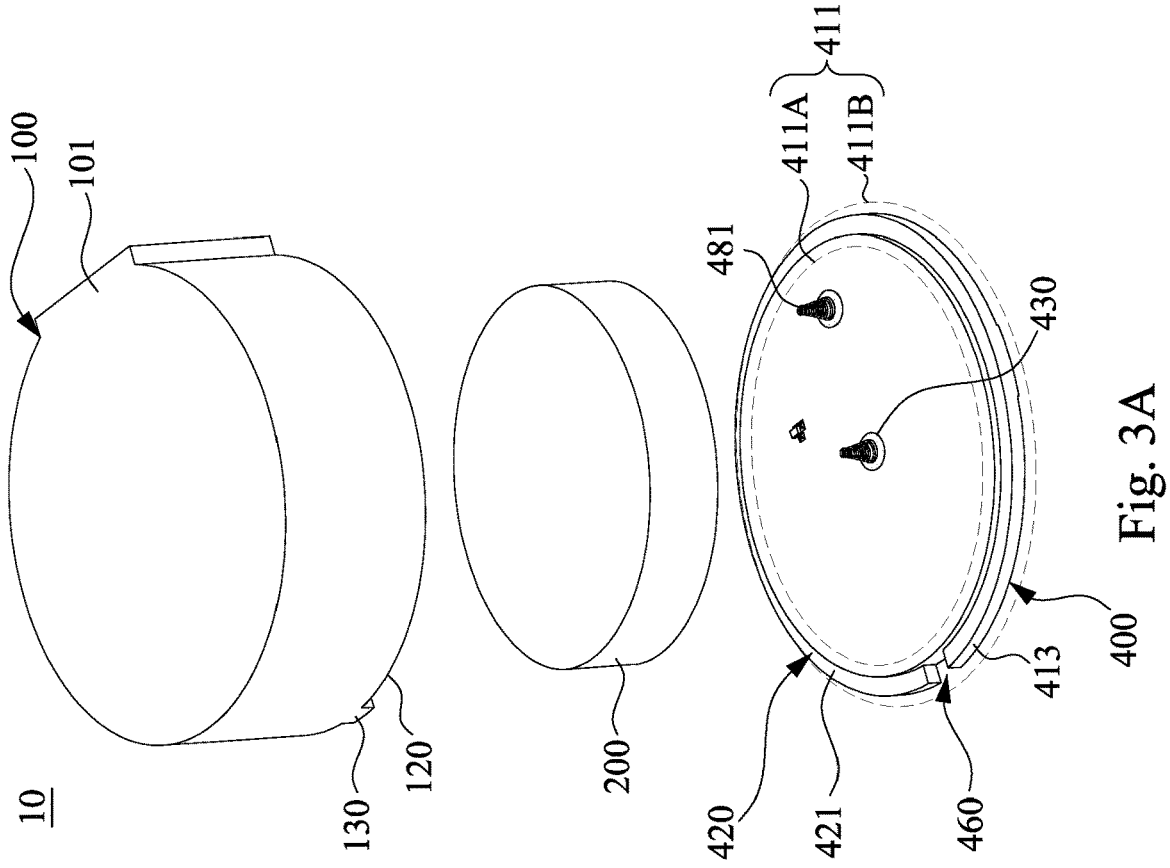
FIG. 3A is a disassembled view of the electroacoustic device of FIG. 1.

Reference is now made to FIG. 1 to FIG. 3B, in which FIG. 1 is a perspective view of an electroacoustic device 10 according to one embodiment of the present disclosure, FIG. 2 is a cross-sectional view of the electroacoustic device 10 viewed along a line AA of FIG. 1, FIG. 3A is a disassembled view of the electroacoustic device 10 of FIG. 1, and FIG. 3B is a disassembled view of the electroacoustic device 10 of FIG. 1 viewed from another aspect. As shown in FIG. 1 to FIG. 2, in this embodiment, the electroacoustic device 10 includes a top cover 100, an electro-acoustic unit 200 and a circuit-board end cover 300. One end (referred to closed end 101 hereinafter) of the top cover 100 is enclosed, and an end surface 102 of another end of the top cover 100 is formed with a sunken portion 110 and a first coupling portion 130 (FIG. 3B). The electro-acoustic unit 200 is fixed within the sunken portion 110. For example, the electro-acoustic unit 200 is limited by a position-limiting structure 111 located in the sunken portion 110 through an adhesion or engagement fashion. The circuit-board end cover 300 completely covers the sunken portion 110, and the circuit-board end cover 300 is completely located outside the sunken portion 110, or at least partially located outside the sunken portion 110, so that the aforementioned sunken portion 110 is collectively shut by the circuit-board end cover 300 and the top cover 100. In addition, the circuit-board end cover 300 is electrically connected to the electro-acoustic unit 200, so that the electro-acoustic unit 200 can be driven to sound by the circuit-board end cover 300.

More specifically, the circuit-board end cover 300 includes a wiring board module 400, one or more (e.g., two) elastic conductive members 481 and a second coupling portion 460 (FIG. 3A). The elastic conductive member 481 is electrically connected the wiring board module 400 and the electro-acoustic unit 200. The second coupling portion 460 is located on the wiring board module 400. Thus, when the second coupling portion 460 is connected to the first coupling portion 130, the circuit-board end cover 300 is assembled to the aforementioned end surface 102 of the top cover 100.

The wiring board module 400 includes a wiring board body 410, one or more (e.g., two) first contacts 430, one or more (e.g., two) second contacts 440 and a layout circuit 450. The wiring board body 410 is formed with a first surface 411 and a second surface 412 which are opposite to each other. The first surface 411 is bonded to the end surface 102 of the top cover 100 through joining features (e.g., screws or adhered layer) for completely cover the sunken portion 110. The first contacts 430 are formed on the first surface 411, and respectively connected to the elastic conductive members 481. The second contacts 440 are formed on the second surface 412. The layout circuit 450 is installed within the wiring board body 410 and connected to the first contacts 430 and the second contacts 440, respectively. The first contacts 430 and the second contacts 440 are, for example, solder pads of a circuit board. One end of each of the elastic conductive members 481 is soldered to one of the first contacts 430, and the other end thereof directly presses an electrical terminal (not shown in figures) of the electro-acoustic unit 200 without solder material, so as to solve the common problems of high difficulty of tradition process (e.g., wire welding or metal piece coupling), high labor cost, and low quality stability.

Furthermore, in this embodiment, the wiring board body 410 includes a plurality of laminated layers (not shown in figures), and the layout circuit 450 includes a plurality of traces 451 and via portions 452 for conducting to the first contacts 430 and the second contacts 440, respectively. The wiring board body 410 is, for example, a heat-resistant glass-fiber board capable of withstanding high-temperature baking of reflow soldering in a reflow oven.

In this embodiment, the wiring board body 410 is a double-sided copper foil circuit board, and the first contacts 430 and the second contacts 440 respectively are solder pads thereon. The top cover 100 is also cylindrical, and the wiring board body 410 is in a shape of a round cake. A circumference surface 413 of the wiring board body 410 is located between the first surface 411 and the second surface 412, surrounds the first surface 411 and the second surface 412, and connects to the first surface 411 and the second surface 412. A maximum width W of the wiring board module 400 is approximately equal to a maximum width W of the top cover 100, however, the present disclosure is not limited thereto. Also, the present disclosure is not limited to the types, shapes, materials and fixing features of the wiring board body 410.

In addition, in the embodiment, the first surface 411 of the wiring board body 410 is divided into a circuit area 411A and a surrounding area 411B completely surrounding the circuit area 411A. The layout circuit 450 is only disposed within the range of the circuit area 411A, but not disposed within the range of the surrounding area 411B. The wiring board body 410 is further provided with a surrounding groove 420 concavely formed in the surrounding area 411B of the first surface 411. The level height of the surrounding groove 420 is different from that of the circuit area 411A. For example, the range of the surrounding groove 420 is approximately equal to that of the surrounding area 411B, and the surrounding groove 420 connected to the circuit area 411A and the circumference surface 413 of the wiring board body 410, however, the present disclosure is not limited thereto.

The top cover 100 is provided with a rim 120 protruding outwardly from a part of the end surface 102 of the top cover 100, and the rim 120, for example is, for example, in an annular shape. Thus, when the rim 120 extends into the surrounding groove 420, the circuit-board end cover 300 is assembled with the top cover 100 to cover the sunken portion 110 of the top cover 100 by the circuit-board end cover 300.

In the embodiment, the first coupling portion 130 is disposed at the rim 120 of the top cover 100, the second coupling portion 460 is disposed at a bottom surface 421 of the surrounding groove 420 of the wiring board body 410, and the second coupling portion 460 and the first coupling portion 130 are complementary in shape. In the embodiment, the first coupling portion 130 is embodied as a convex structure, and the convex structure is integrally formed on one surface of the rim 120 of the top cover 100 facing away from the closed end 101. The second coupling portion 460 is embodied as a concave structure. The concave structure is, for example, a through hole connecting to the bottom surface 421 of the surrounding groove 420 and the second surface 412 of the wiring board body 410. However, the present disclosure is not limited thereto, and the second coupling portion 460 may also be a blind hole. Thus, when the circuit-board end cover 300 covers the top cover 100, the circuit-board end cover 300 can be fixed on the top cover 100 by inserting the convex structure into the concave structure, so as not to be easily detached from the top cover 100.

In one embodiment, the above-mentioned electro-acoustic unit 200 is a buzzer (e.g., a piezoelectric buzzer or a magnetic buzzer), but the present disclosure is not limited to the type of the electro-acoustic unit 200. In other embodiments, the above-mentioned electro-acoustic unit 200 may also be a speaker (e.g., a dynamic speaker or a metal diaphragm) or a microphone.

In one embodiment, if the material characteristic of the top cover 100 and the electro-acoustic unit 200 cannot withstand high-temperature baking in reflow oven so as to be damage, the assembly sequence of the electroacoustic device 10 of the embodiment is roughly processed as follows.

After the first contacts 430 of the wiring board body 410 are printed with solder pastes by an automatic printing machine (e.g., SMT machine), the elastic conductive members 481 are placed to stand on the solder pastes, respectively. In this way, the advantages of saving labor hours, improving manufacturing process and high productivity and stable quality can be provided; then, the wiring board module 400 is sent into the reflow soldering furnace, so that the solder pastes are melted by the high temperature of the reflow soldering furnace for soldering the elastic conductive members 481 onto the first contacts 430. Next, after the electro-acoustic unit 200 is fixed in the sunken portion 110, the circuit-board end cover 300 directly covers the end surface 102 of the top cover 100, so that the elastic conductive members 481 can just directly abut against the corresponding electrical terminals (not shown in figures) of the electro-acoustic unit 200, thereby completing the electroacoustic device 10 of this embodiment, however, the present disclosure is not limited thereto.

In one embodiment, the electro-acoustic unit 200 of the electroacoustic device 10 can be produced using standard materials and standard processes, instead of using high-temperature materials and special processes that can withstand the temperature of the reflow oven. Therefore, if the material properties of the wiring board body 410, the top cover 100, and the sounding body of the electro-acoustic unit 200 can withstand the high-temperature baking of the reflow oven without damage, the assembled electroacoustic device 10 can be directly sent into the reflow oven, and the wiring board module 400 and the top cover 100 can be assembled together without waiting for baking. This can simplify procedures and reduce manufacturing costs.

FIG. 4 is a disassembled view of the electroacoustic device 11 according to one embodiment of the present disclosure. As shown in FIG. 4, in this embodiment, the electroacoustic device 11 of the embodiment and the electroacoustic device 10 of FIG. 1 are substantially the same, except that the first coupling portion 140 is embodied as a concave structure, and the concave structure is formed on the surface of the rim 120 thereof. The second coupling portion 470 is embodied as a convex structure. The convex structure is integrally formed on the bottom surface 421 of the surrounding groove 420, and connected to the circuit area 411A so that the level height of the convex structure is the same as that of the circuit area 411A. Thus, when the circuit-board end cover 301 covers the top cover 100, the circuit-board end cover 301 can be fixed on the top cover 100 by inserting the convex structure into the concave structure, so as not to be easily detached from the top cover 100.

In addition, compared with the electroacoustic device 10 (FIG. 3A) of the aforementioned embodiment, these elastic conductive members 481 are springs (e.g., tower springs or helical compression springs, etc.), and the long axis direction L is perpendicular to the first surface 411 of the wiring board body 410. The elastic conductive members 482 of this embodiment are elastic piece rather than tower spring, such as horizontal shrapnel in the form of tilted arms, and each of the elastic conductive members 482 gradually moves away from the first surface 411 of the wiring board body 410 in the direction of the top cover 100.

Figure 5:
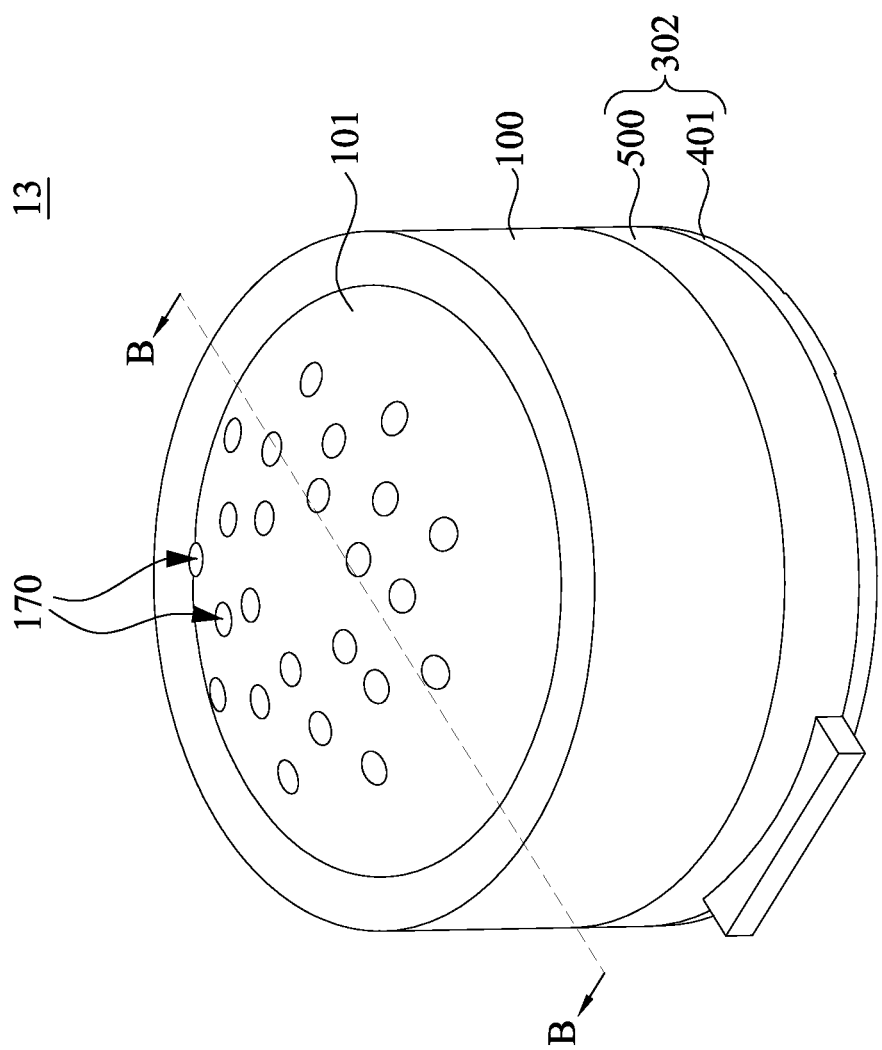
FIG. 5 is a perspective view of an electroacoustic device according to one embodiment of the present disclosure.
Figure 6:
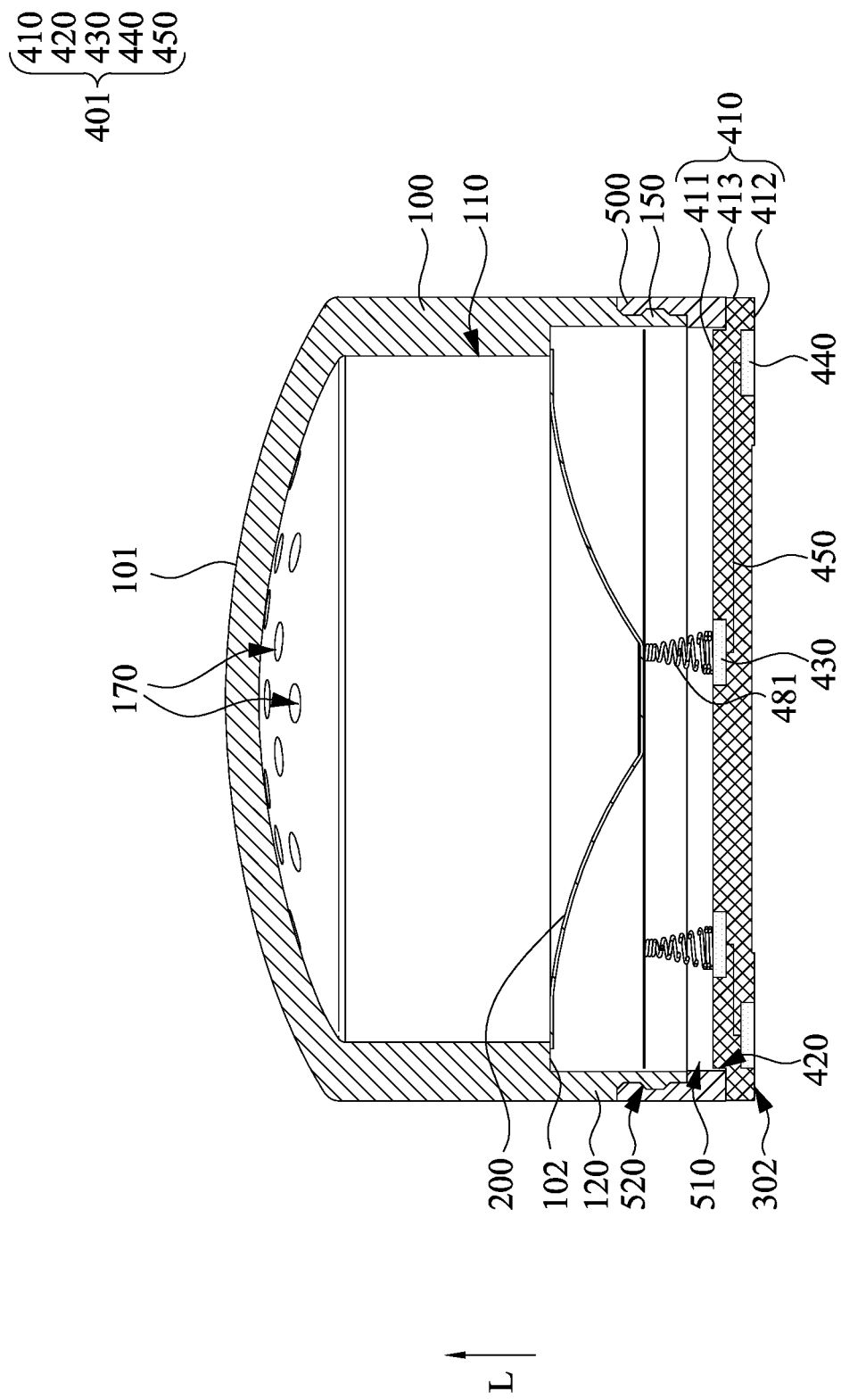
FIG. 6 is a cross-sectional view of the electroacoustic device viewed along a line BB of FIG. 5.
Figure 7:
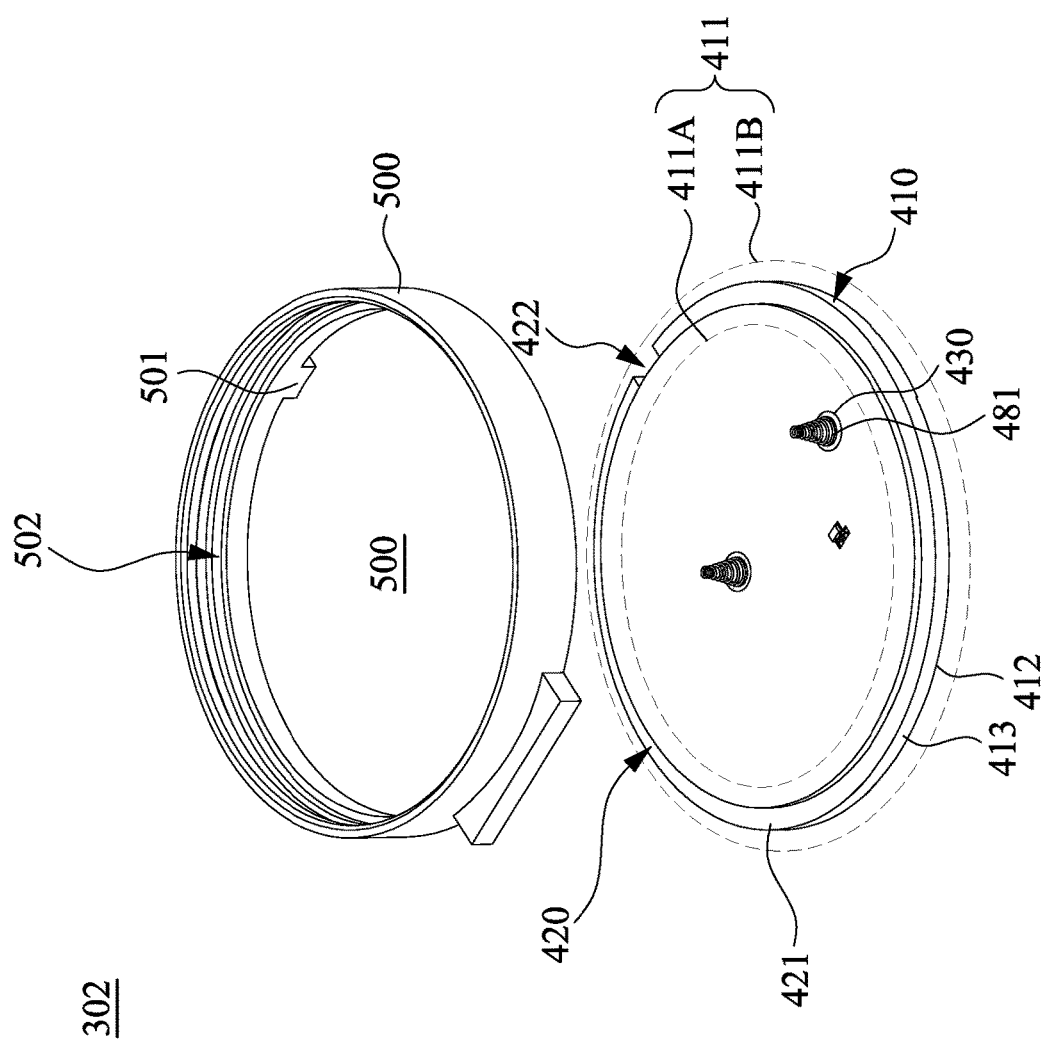
FIG. 7 is a disassembled view of the circuit-board end cover of FIG. 6.

Reference is now made to FIG. 5 to FIG. 7, in which FIG. 5 is a perspective view of an electroacoustic device 12 according to one embodiment of the present disclosure. FIG. 6 is a cross-sectional view of the electroacoustic device 12 viewed along a line BB of FIG. 5. FIG. 7 is a disassembled view of the circuit-board end cover 302 of FIG. 6. As shown in FIG. 5 to FIG. 7, in this embodiment, the electroacoustic device 12 of the embodiment and the electroacoustic device 10 of FIG. 1 are substantially the same, except that the circuit-board end cover 302 further includes a side frame unit 500. The side frame unit 500 is located on one side of the wiring board module 401 facing towards the top cover 100, and the side frame unit 500 and the wiring board module 401 collectively cover the end surface 102 of the top cover 100 so that the side frame unit 500 is fixed between the top cover 100 and the wiring board module 401 (FIG. 6).

More specifically, one side of the side frame unit 500 is fixed in the surrounding groove 420 of the wiring board body 410, and the side frame unit 500 completely surrounds the circuit area 411A. Therefore, the side frame unit 500 surrounds an inner space 510 capable of accommodating the circuit area 411A. The side frame unit 500 is integrally engaged with the wiring board body 410.

For example, the side frame unit 500 is jointed to the first surface 411 of the wiring board body 410 through insert molding. Furthermore, the wiring board body 410 is formed with a material-grabbing groove 422. The material-grabbing groove 422 is recessed on the bottom surface 421 of the surrounding groove 420 of the wiring board body 410. In this embodiment, the material-grabbing groove 422 is, for example, a through hole, which connects the bottom surface 421 of the surrounding groove 420 and the second surface 412 of the wiring board body 410, respectively. However, the disclosure is not limited thereto, and the material-grabbing groove 422 can also be a blind hole. In this way, when the wiring board body 410 is processed through an embedded injection process, the side frame unit 500 is formed on the wiring board body 410, and one part of material (see the part 501) flows into the material-grabbing groove 422, so as to improve the joint strength of the side frame unit 500 attached to the wiring board body 410, so as not to be easily detached from the wiring board body 410.

In this embodiment, the first coupling portion 150 is installed on the rim 120. The second coupling portion 520 is formed on the side frame unit 500 rather than the wiring board module 401. The circuit-board end cover 302 is assembled with the top cover 100 through the rim 120 inserting into the inner space 510.

More specifically, the first coupling portion 150 is formed on the inner side of the rim 120 facing towards the sunken portion 110. The second coupling portion 520 is formed on an inner wall of the side frame unit 500 facing towards the inner space 510, and the second coupling portion 520 and the first coupling portion 150 are complementary in shape. Thus, the circuit-board end cover 302 is fixedly connected to the top cover 100 through the first coupling portion 150 and the second coupling portion 520 coupled to each other. In the embodiment, the first coupling portion 150 is embodied as a convex structure, and the convex structure is integrally formed on the inner side of the rim 120 facing towards the sunken portion 110. The second coupling portion 520 is embodied as a concave structure. The concave structure is formed on an inner wall of the side frame unit 500 facing towards the inner space 510. However, the present disclosure is not limited thereto. Thus, when the circuit-board end cover 300 covers the top cover 100, the circuit-board end cover 302 can be fixed on the top cover 100 by inserting the convex structure into the concave structure, so as not to be easily detached from the top cover 100.

Furthermore, the top cover 100 is further formed with a plurality of sound holes 170. The sound holes 170 are respectively formed on the closed end 101 of the top cover 100 and connected to the sunken portion 110 for transmitting the sound of the electro-acoustic unit 200 outwardly.

Figure 8:
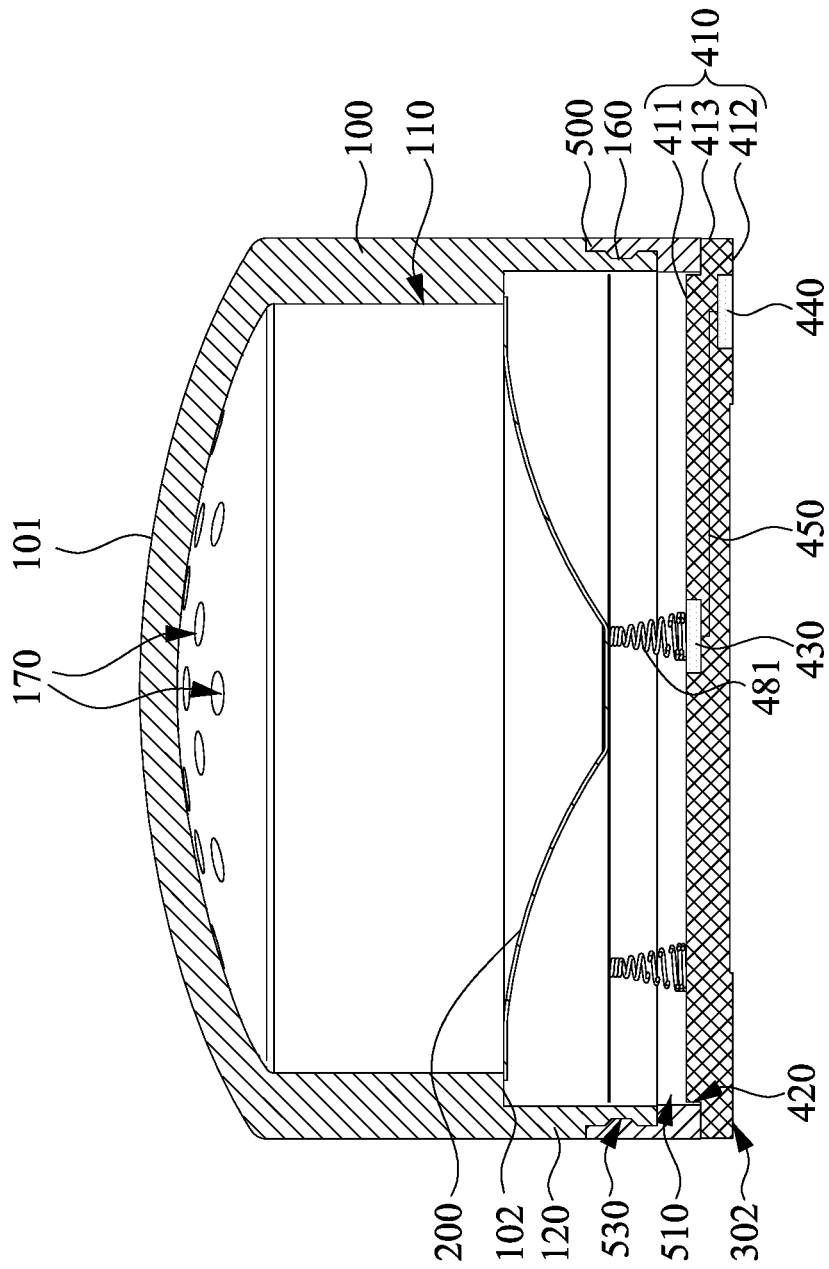
FIG. 8 is a cross-sectional view of an electroacoustic device according to one embodiment of the present disclosure.

FIG. 8 is a cross-sectional view of an electroacoustic device 13 according to one embodiment of the present disclosure. As shown in FIG. 8, the electroacoustic device 13 of the embodiment and the electroacoustic device 12 of FIG. 7 are substantially the same, except that, in this embodiment, the first coupling portion 160 is embodied as a concave structure. The concave structure is formed on an inner side of the rim 120 facing towards the sunken portion 110 and the concave structure surrounds the sunken portion 110. The second coupling portion 530 is embodied as a convex structure. The convex structure is integrally formed on an inner wall of the side frame unit 500 facing towards the inner space 510, and the convex structure surrounds the inner space 510. Thus, when the circuit-board end cover 302 covers the top cover 100, the circuit-board end cover 302 can be fixed on the top cover 100 by inserting the convex structure into the concave structure, so as not to be easily detached from the top cover 100.

Figure 9:
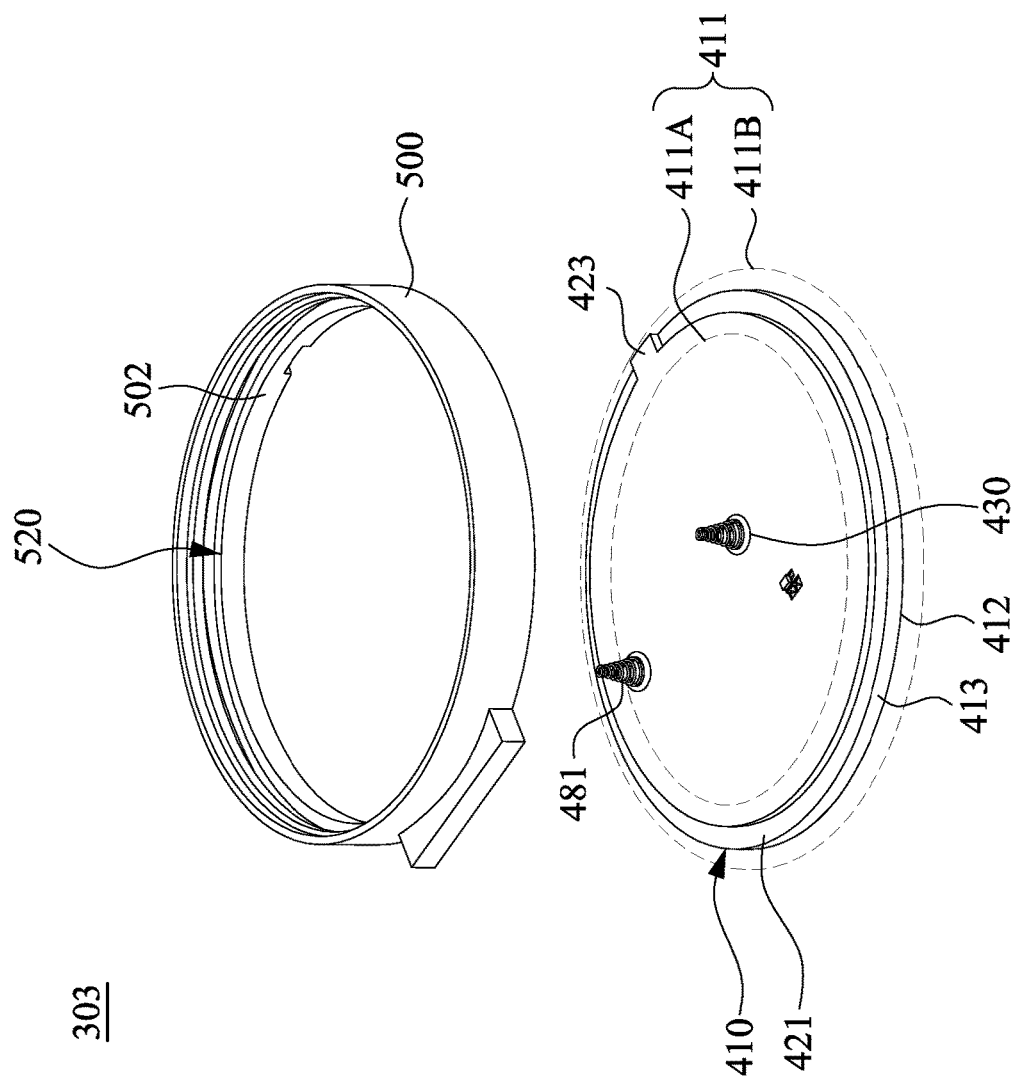
FIG. 9 is a disassembled view of a circuit-board end cover according to one embodiment of the present disclosure.

FIG. 9 is a disassembled view of a circuit-board end cover 303 according to one embodiment of the present disclosure. As shown in FIG. 9, the circuit-board end cover 303 of the embodiment and the circuit-board end cover 302 of FIG. 7 are substantially the same, except that, in this embodiment, the circuit-board end cover 303 is provided with a material-grabbing rib 423. The material-grabbing rib 423 is integrally formed on the bottom surface 421 of the surrounding groove 420 and connected to the circuit area 411A, so that the level height of the material-grabbing rib 423 is the same as that of the circuit area 411A. In this way, when the wiring board body 410 is processed through an embedded injection process, the side frame unit 500 is formed on the wiring board body 410, and one part of material (see the part 502) wraps the material-grabbing rib 423, so as to improve the joint strength of the side frame unit 500 attached to the wiring board body 410, so as not to be easily detached from the wiring board body 410.

Thus, through the construction of the embodiments above, the disclosure is able to simplify the structure of the electroacoustic device, effectively shorten the overall thickness of the electroacoustic device, save materials and shorten labor hours, thereby improving the market competitiveness of products.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An electroacoustic device, comprising:
   a top cover, one end surface of the top cover is formed with a sunken portion and a first coupling portion;
   an electro-acoustic unit fixedly received in the sunken portion; and
   a circuit-board end cover completely covering the sunken portion, and the circuit-board end cover comprises:
      a wiring board module;
      at least one elastic conductive member fixed on the wiring board module and electrically connected to the wiring board module and the electro-acoustic unit; and
      a second coupling portion located on the wiring board module and connected to the first coupling portion.

2. The electroacoustic device of claim 1, wherein the wiring board module comprising:
   a wiring board body formed with a first surface and a second surface which are opposite to each other, the first surface that is bonded to the end surface of the top cover and completely covering the sunken portion;
   at least one first contact formed on the first surface and connected to the at least one elastic conductive member;
   at least one second contact formed on the second surface; and
   a layout circuit installed within the wiring board body and connected to the at least one first contact and the at least one second contact, respectively.

3. The electroacoustic device of claim 2, wherein the first surface of the wiring board body is divided into a circuit area and a surrounding groove, the layout circuit is deployed within the circuit area, and the surrounding groove surrounds the circuit area; and
   the top cover that is provided with a rim protruding outwardly from a part of the end surface of the top cover, and the circuit-board end cover is assembled with the top cover through the rim extending into the surrounding groove.

4. The electroacoustic device of claim 3, wherein the first coupling portion is disposed at the rim of the top cover, the second coupling portion is disposed at a bottom surface of the surrounding groove of the wiring board body, and the second coupling portion and the first coupling portion are complementary in shape, and the first coupling portion and the second coupling portion are concave structure and convex structure, respectively.

5. The electroacoustic device of claim 1, wherein the circuit-board end cover further comprises:
   a side frame unit that is fixed between the top cover and the wiring board module, wherein the second coupling portion is formed on the side frame unit.

6. The electroacoustic device of claim 5, wherein the wiring board module comprises:
   a wiring board body formed with a first surface and a second surface which are opposite to each other, and the first surface integrally engaged with the side frame unit;
   at least one first contact formed on the first surface and connected to the at least one elastic conductive member;
   at least one second contact formed on the second surface; and
   a layout circuit installed within the wiring board body and connected to the at least one first contact and the at least one second contact, respectively.

7. The electroacoustic device of claim 6, wherein the first surface of the wiring board body is divided into a circuit area and a surrounding groove, the layout circuit is deployed within the circuit area, and the surrounding groove surrounds the circuit area, and the side frame unit is fixed within the surrounding groove to surround the circuit area.

8. The electroacoustic device of claim 7, wherein the top cover that is provided with a rim protruding outwardly from a part of the end surface of the top cover, and the side frame unit surrounds an inner space capable of accommodating the circuit area, wherein the circuit-board end cover is assembled with the top cover through the rim extending into the inner space.

9. The electroacoustic device of claim 8, wherein the first coupling portion is formed on an inner side of the rim, the second coupling portion is formed on an inner wall of the side frame unit facing towards the inner space, and the second coupling portion and the first coupling portion are complementary in shape, and the first coupling portion and the second coupling portion are concave structure and convex structure, respectively, wherein the circuit-board end cover is fixedly connected to the top cover by inserting the convex structure into the concave structure.

10. The electroacoustic device of claim 1, wherein a maximum width of the wiring board module is equal to a maximum width of the top cover.

11. The electroacoustic device of claim 1, wherein the electro-acoustic unit is one of a speaker, a microphone and a buzzer.

12. The electroacoustic device of claim 1, wherein the at least one elastic conductive member is one of a spring and an elastic piece.

13. A circuit-board end cover suitable for covering a top cover of an electroacoustic device and electrically conducting to an electro-acoustic unit received within the top cover, and the circuit-board end cover comprising:
   a wiring board module comprising a wiring board body formed with a first surface and a second surface which are opposite to each other; at least one first contact formed on the first surface; at least one second contact formed on the second surface; and a layout circuit installed within the wiring board body and connected to the at least one first contact and the at least one second contact, respectively;

at least one elastic conductive member fixed on the wiring board module, connected to the at least one first contact, and electrically connected to the wiring board module; and a coupling portion located on the wiring board module for connecting to the top cover.

14. The circuit-board end cover of claim 13, wherein the first surface of the wiring board body is divided into a circuit area and a surrounding groove, the layout circuit is deployed within the circuit area, and the surrounding groove surrounds the circuit area.

15. The circuit-board end cover of claim 14, wherein the coupling portion is disposed at a bottom surface of the surrounding groove of the wiring board body.

16. The circuit-board end cover of claim 14, further comprising:

a side frame unit that is fixed within the surrounding groove to surround the circuit area and surrounds an inner space capable of accommodating the circuit area, wherein the coupling portion is formed on the side frame unit.

17. The circuit-board end cover of claim 16, wherein the coupling portion is formed on an inner wall of the side frame unit facing towards the inner space.

18. The circuit-board end cover of claim 13, wherein a maximum width of the wiring board module is equal to a maximum width of the top cover.

19. The circuit-board end cover of claim 13, wherein the at least one elastic conductive member is one of a spring and an elastic piece.

* * * * *